US008563365B2

(12) United States Patent
King, Jr. et al.

(10) Patent No.: US 8,563,365 B2
(45) Date of Patent: Oct. 22, 2013

(54) AIR-GAP C4 FLUIDIC I/O INTERCONNECTS AND METHODS OF FABRICATING SAME

(75) Inventors: Calvin Richard King, Jr., Atlanta, GA (US); Jesal Zevari, Bellevue, WA (US); James D. Meindl, Atlanta, GA (US); Muhannad S. Bakir, Atlanta, GA (US)

(73) Assignee: Georgia Tech Research Corporation, Atlanta, GA (US)

(*) Notice: Subject to any disclaimer, the term of this patent is extended or adjusted under 35 U.S.C. 154(b) by 25 days.

(21) Appl. No.: 13/416,849

(22) Filed: Mar. 9, 2012

(65) Prior Publication Data

US 2012/0228779 A1 Sep. 13, 2012

Related U.S. Application Data

(60) Provisional application No. 61/450,844, filed on Mar. 9, 2011.

(51) Int. Cl.
*H01L 23/34* (2006.01)
*H01L 21/00* (2006.01)

(52) U.S. Cl.
USPC ........... 438/122; 257/713; 257/714; 257/715; 257/716; 257/721; 257/E23.085; 257/E23.097; 257/E23.098; 257/E23.099; 257/E21.499

(58) Field of Classification Search
USPC ........................ 438/122; 257/713–716, 721
See application file for complete search history.

(56) References Cited

U.S. PATENT DOCUMENTS

| 5,767,580 | A  | * | 6/1998  | Rostoker ....................... 257/737 |
| 7,592,697 | B2 | * | 9/2009  | Arana et al. .................. 257/714 |
| 7,928,563 | B2 | * | 4/2011  | Bakir et al. ................... 257/713 |
| 7,968,445 | B2 | * | 6/2011  | Lin et al. ....................... 438/613 |
| 8,049,329 | B2 | * | 11/2011 | Baek et al. .................... 257/714 |
| 8,159,065 | B2 | * | 4/2012  | Suh et al. ...................... 257/712 |
| 8,253,234 | B2 | * | 8/2012  | Barowski et al. ............. 257/691 |
| 8,299,608 | B2 | * | 10/2012 | Bartley et al. ................ 257/712 |
| 8,310,046 | B2 | * | 11/2012 | Baek et al. .................... 257/714 |
| 8,367,478 | B2 | * | 2/2013  | Bartley et al. ................ 438/122 |
| 2003/0052156 | A1 | * | 3/2003 | Kim et al. ................ 228/180.22 |
| 2007/0063337 | A1 | * | 3/2007 | Schubert et al. ............. 257/714 |
| 2007/0085198 | A1 | * | 4/2007 | Shi et al. ...................... 257/714 |
| 2009/0057881 | A1 | * | 3/2009 | Arana et al. .................. 257/714 |
| 2010/0187682 | A1 | * | 7/2010 | Pinjala et al. ................. 257/713 |
| 2011/0031633 | A1 | * | 2/2011 | Hsu et al. ...................... 257/777 |
| 2011/0215457 | A1 | * | 9/2011 | Park ............................. 257/686 |

* cited by examiner

*Primary Examiner* — David Zarneke
(74) *Attorney, Agent, or Firm* — Dustin B. Weeks, Esq.; Ryan A. Schneider, Esq.; Troutman Sanders LLP

(57) ABSTRACT

An exemplary embodiment of the present invention provides a chip for use in fabricating a three-dimensional integrated circuit, the chip comprising a wafer, one or more metallic-filled, electrical vias, and one or more hollow, fluidic vias. The wafer can comprise a first surface and a second surface. The one or more metallic-filled, electrical vias can extend through the wafer. Each electrical via can be in electrical communication with an electrical interconnect proximate the first surface, providing electrical communication between chips in the integrated circuit. The one or more hollow, fluidic vias can extend through the wafer. Each fluidic via can be in fluid communication with a fluidic interconnect, providing fluid communication between adjacent chips in the integrated circuit. Each fluidic interconnect can comprise a first end proximate the first surface, a second end, and a cap proximate the second end, defining an air-filled space within the fluidic interconnect.

20 Claims, 9 Drawing Sheets

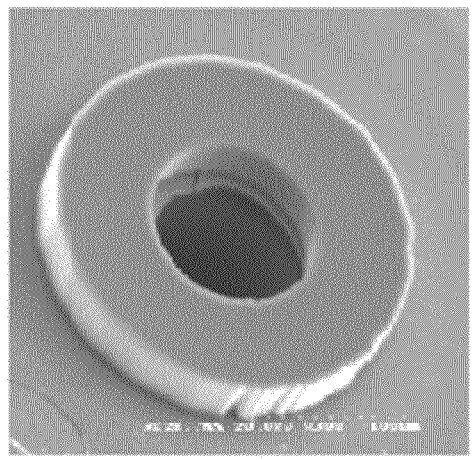
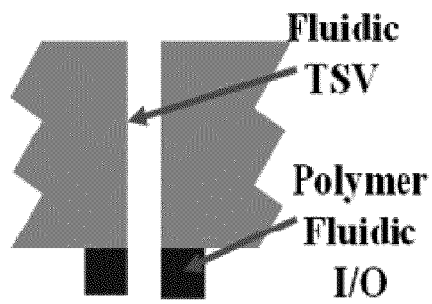
FIG. 3A
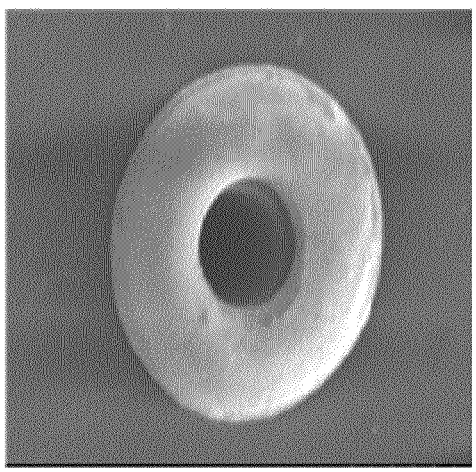
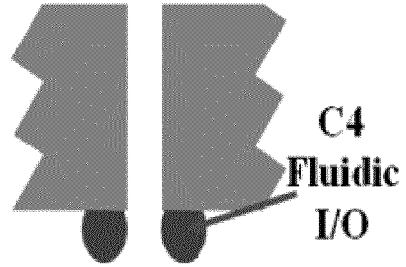
FIG. 3B
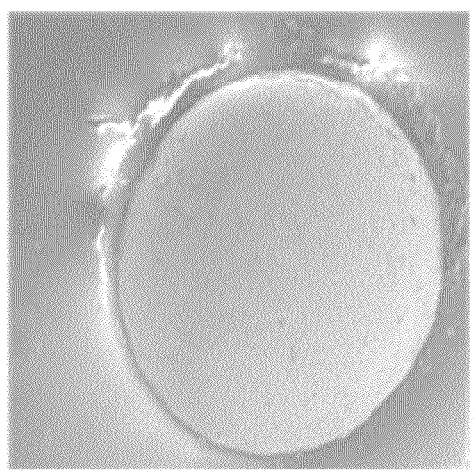
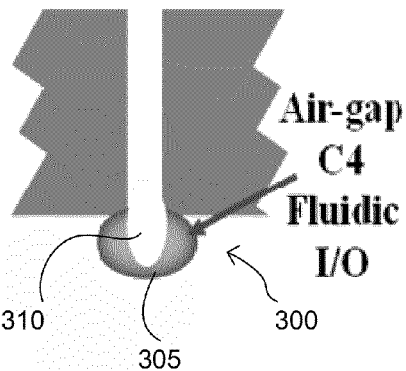
FIG. 3C

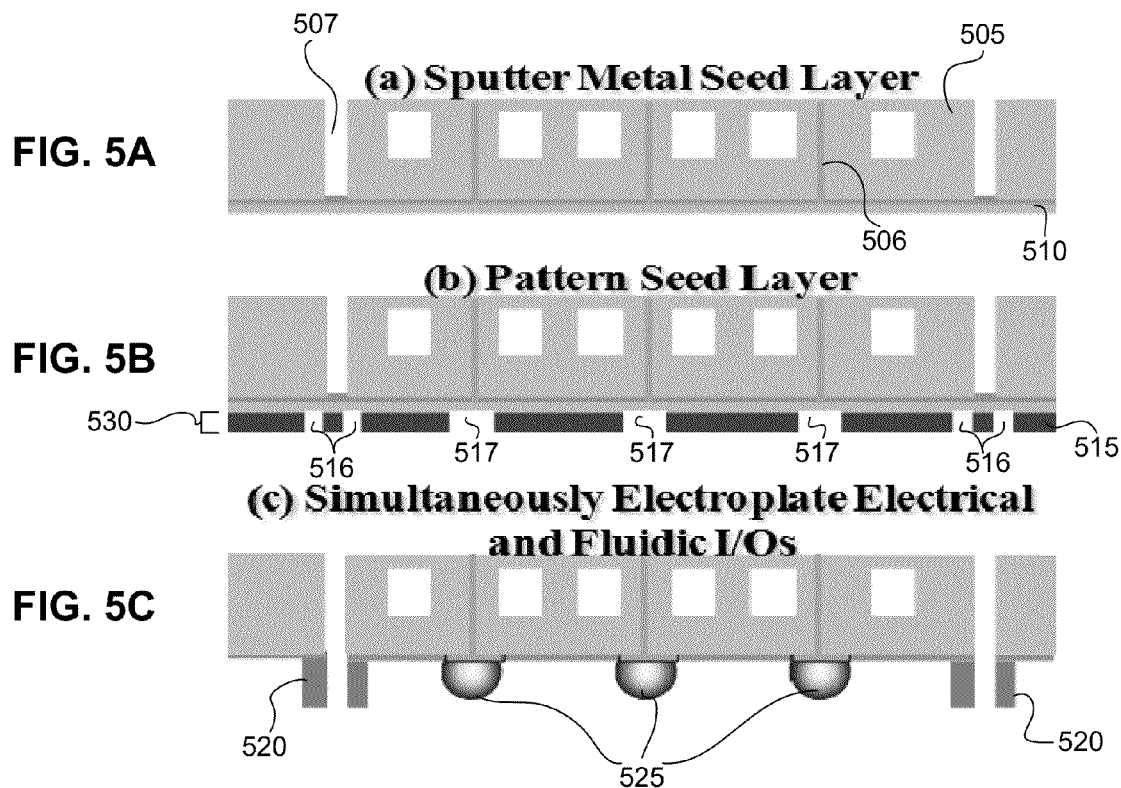
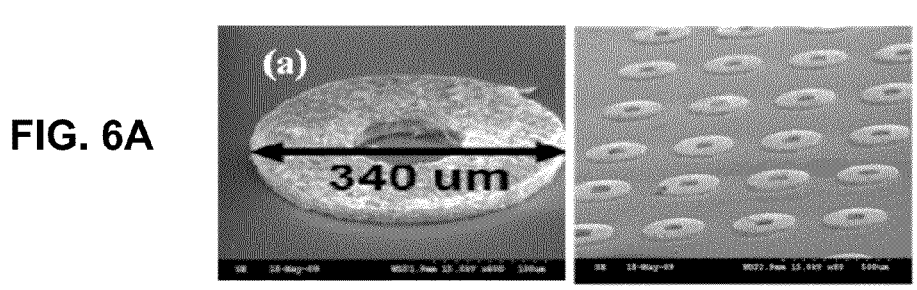
FIG. 6A
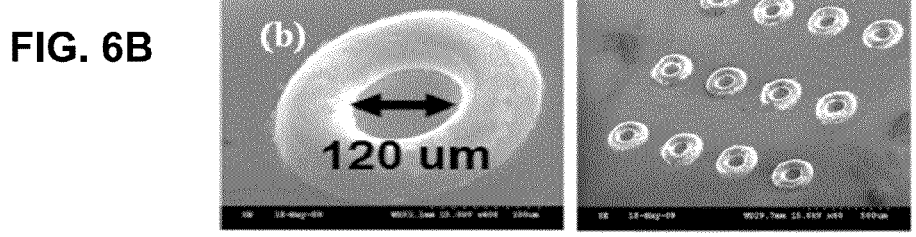
FIG. 6B

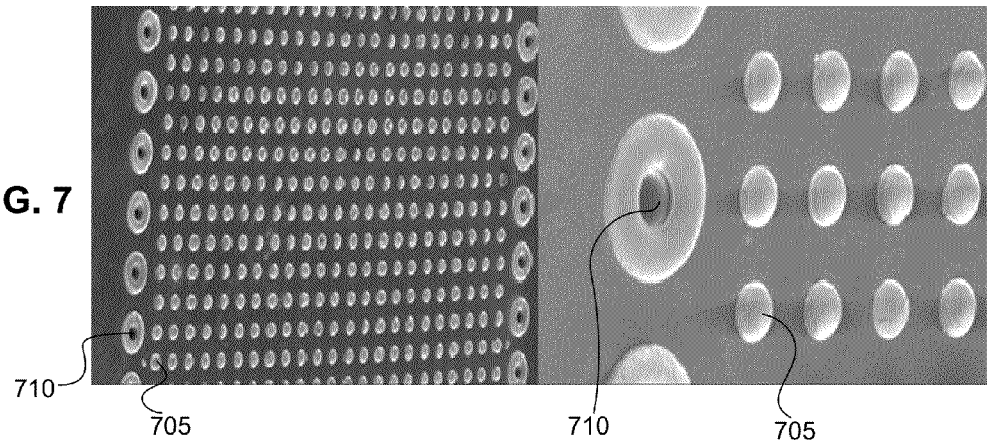
FIG. 7
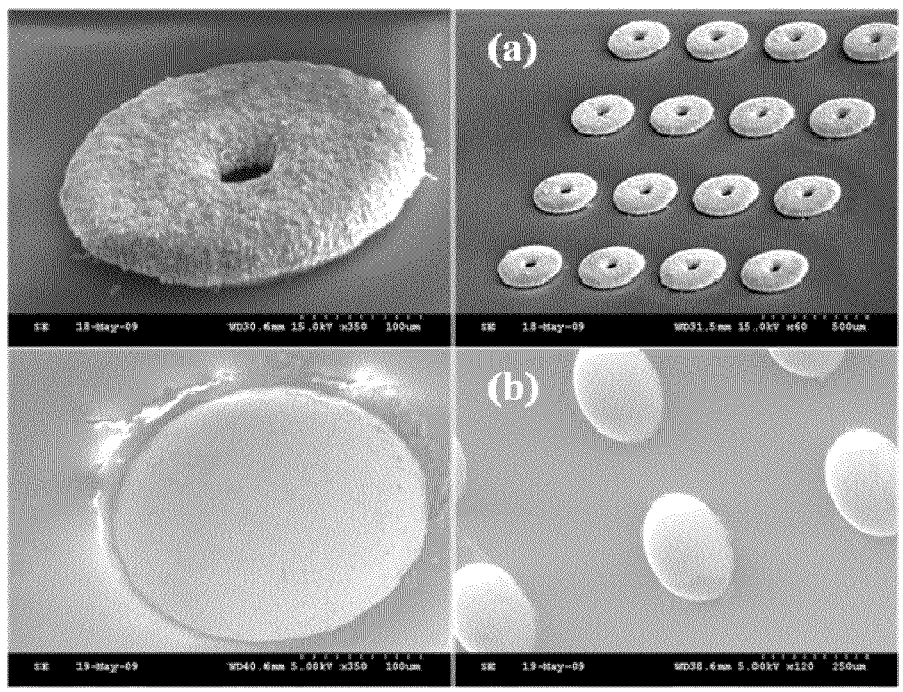
FIG. 8A
FIG. 8B

AIR-GAP C4 FLUIDIC I/O INTERCONNECTS AND METHODS OF FABRICATING SAME

CROSS-REFERENCE TO RELATED APPLICATIONS

This application claims the benefit of U.S. Provisional Application Ser. No. 61/450,844, filed on 9 Mar. 2011, which is incorporated herein by reference in its entirety as if fully set forth below.

FEDERALLY SPONSORED RESEARCH STATEMENT

This invention was made with Government support under Agreement No. HR0011-10-3-0002, awarded by DARPA. The Government has certain rights in the invention.

TECHNICAL FIELD OF THE INVENTION

The various embodiments of the present disclosure relate generally to integrated circuits and associated methods of fabrication. More particularly, the various embodiments of the present invention are directed to three-dimensional integrated circuits and methods of fabricating same including microfluidic interconnects for managing thermal energy created during operation of three-dimensional integrated circuits.

BACKGROUND OF THE INVENTION

As transistor technology continues to scale and integration density increases, one performance limiter of an integrated circuit ("IC") chip will be heat management and/or removal. Not only does heat affect device operation, but it may also affect end user usage patterns. Further, because the reliability and performance of transistors and interconnects depend on operating temperatures, the need to cool electronics and diminish device hot spots has never been greater. With the continued scaling of device features and increased power density, chip cooling has become increasingly difficult and costly.

One method of continued scaling includes three-dimensional ("3D") stacking of chips used to form a stacked IC package. 3D die (e.g., silicon chip die) stacking increases transistor density and chip functionality by vertically integrating two or more die. 3D integration also improves interconnect speed by decreasing interconnect wire length, enables smaller system form factor, and reduces power dissipation and crosstalk.

Motivations for 3D integration include reduction in system size, interconnect delay, power dissipation, and enabling hyper-integration of chips fabricated using disparate process technologies. Although various low-power commercial products implement improved performance and increased device packing density realized by 3D stacking of chips (e.g., using wire bonds), such technologies are not suitable for high-performance chips due to ineffective power delivery and heat removal. For example, high performance chips are projected to dissipate more than 100 W/cm$^2$ and require more than 100 A of supply current. Consequently, when such chips are stacked, challenges in power delivery and cooling become greatly exacerbated.

Systems and methods for cooling 3D ICs using microfluidic interconnects have been proposed by the inventors of the present application, e.g. U.S. Pat. No. 7,928,563, which is incorporated herein by reference in its entirety as if fully set forth below. Unfortunately, fabrication of these conventional 3D ICs can be a tedious process requiring separate steps for fabrication of fluidic and electrical interconnects. Another disadvantage of conventional cooling methods is the need for polymer sockets to seal fluidic interconnects, thus necessitating additional space between adjacent chips in a stack. Yet another disadvantage of conventional cooling methods is the need for an epoxy-based sealant/underfill to be applied to the chips creating a hermetic seal, which limits the possibility of reworking, i.e. disconnecting and/or rearranging, chips once the 3D stack is assembled.

Accordingly, there is a desire for chips, 3D ICs, and methods of fabricating same, which address the disadvantages associated with conventional chips and fabrication methods. Various embodiments of the present invention address these desires.

BRIEF SUMMARY OF THE INVENTION

The present invention relates to 3D ICs and methods of constructing same. An exemplary embodiment of the present invention provides a chip for use in fabricating a 3D IC comprising a wafer and one or more hollow-fluidic vias. The wafer comprises a first surface and a second surface. The one or more hollow, fluidic vias can extend through the wafer between the first surface and the second surface. Each of the fluidic vias can be in fluid communication with a fluidic interconnect. When the chip is integrated into a 3D IC, each fluidic interconnect can provide fluid communication between the chip and an adjacent chip in the 3D IC. Each fluidic interconnect can comprise a first end proximate the first surface of the wafer, a second end, and a cap proximate the second end. The cap can define an air-filled space within the fluidic interconnect. In another exemplary embodiment of the present invention, the chip further comprises one or more metallic-filled, electrical vias. The one or more metallic-filled, electrical vias can extend through the wafer between the first surface and the second surface. Each of the electrical vias can be in electrical communication with an electrical interconnect proximate the first surface. Each electrical interconnect can provide electrical communication between adjacent chips in a 3D IC.

The present invention also provides methods of fabricating chips for use in fabricating a 3D IC. In an exemplary embodiment of the present invention, a method of fabricating a chip comprises providing a wafer comprising one or more fluidic vias, sputtering a seed layer on a first surface of the wafer, patterning an electroplating mold into the seed layer, the electroplating mold comprising an aperture for each of the one or more fluidic vias, and electroplating solder into the apertures of the electroplating mold. In another exemplary embodiment of the present invention, the method further comprises removing the electroplating mold. In still yet another exemplary embodiment of the present invention, the method further comprises reflowing the solder. In some embodiments of the present invention, electroplating solder comprises depositing solder to a height greater than a height of the electroplating mold. Additionally, in some embodiments of the present invention, reflowing the solder forms caps partially defining air filled spaces within fluid interconnects.

The present invention also provides methods of fabricating a 3D ICs. In an exemplary embodiment of the present invention, a method of fabricating a 3D IC comprises providing a first chip, providing a second chip, aligning the first chip and the second chip, and wetting binding elements to bind the first chip to the second chip. In some embodiments of the present invention, each of one or more electrical vias and/or one or more fluidic vias of the second chip comprise a binding element proximate a second surface of a wafer of the second chip, and each binding element comprises a solder wettable material. In some embodiments of the present invention, aligning the first chip and second chip is performed, such that the one or more fluidic interconnects of the first chip and/or the one or more electrical interconnects of the first chip are positioned proximate corresponding binding elements of the second chip. In some embodiments of the present invention, wetting the binding elements removes at least a portion of a cap of each fluidic interconnect of the first chip, such that the fluidic interconnects of the first chip provide fluid communication between the one or more fluidic vias of the first chip and corresponding fluidic vias of the second chip. In some embodiments of the present invention, wetting the binding elements causes electrical interconnects of the first chip to provide electrical communication between one or more electrical vias of the first chip and corresponding electrical vias of the second chip. In an exemplary embodiment of the present invention, the solder wettable material comprises copper. In another exemplary embodiment of the present invention, at least one of the binding elements is ring-shaped.

In another exemplary embodiment of the present invention, a method of fabricating a 3D IC comprises fabricating a first chip comprising providing a wafer comprising one or more electrical vias and one or more fluidic vias, sputtering a seed layer on a first surface of the wafer, patterning an electroplating mold into the seed layer, the electroplating mold comprising an aperture for each of the one or more fluidic vias and an aperture for each of the one or more electrical vias, and simultaneously electroplating solder into the apertures of the electroplating mold to form a fluidic, air-filled interconnect proximate each of the one or more fluidic vias and an electrical interconnect proximate each of the one or more electrical vias. In another exemplary embodiment of the present invention, the method further comprises: fabricating a second chip; and aligning the first chip with the second chip. In yet another exemplary embodiment of the present invention, the method further comprises removing the electroplating mold. In even yet another exemplary embodiment of the present invention, the method further comprises reflowing the solder. In some embodiments of the present invention, simultaneously electroplating solder comprises depositing solder to a height greater than a height of the electroplating mold. In another exemplary embodiment of the present invention, the method further comprises merging solder at the apertures corresponding to the one or more fluidic vias to form a cap, which partially defines an air-filled space within the fluid interconnects.

In an exemplary embodiment of the method of fabricating a 3D IC discussed above, the second chip comprises a second wafer comprising a first surface and a second surface, one or more metallic-filled, electrical vias extending through the second wafer between the first surface and second surface, one or more hollow, fluidic vias extending through the second wafer between the first surface and the second surface, and a plurality of binding elements corresponding to and positioned adjacent each of the electrical and fluidic vias proximate the first surface of the second wafer.

In another exemplary embodiment of the method of fabricating a 3D IC discussed above, the method further comprises aligning the first chip and the second chip such that the fluidic interconnects of the first chip and the electrical interconnects of the first chip are positioned proximate corresponding binding elements of the second chip, and wetting the binding elements to bind the first chip to the second chip. In some embodiments of the present invention, wetting removes at least a portion of the cap of each fluidic interconnect of the first chip, such that the fluidic interconnects of the first chip provide fluid communication between the one or more fluidic vias of the first chip and corresponding fluidic vias of the second chip. Further, in some embodiments of the present invention, wetting causes the electrical interconnects of the first chip to provide electrical communication between the one or more electrical vias of the first chip and corresponding electrical vias of the second chip.

These and other aspects of the present invention are described in the Detailed Description of the Invention below and the accompanying figures. Other aspects and features of embodiments of the present invention will become apparent to those of ordinary skill in the art upon reviewing the following description of specific, exemplary embodiments of the present invention in concert with the figures. While features of the present invention may be discussed relative to certain embodiments and figures, all embodiments of the present invention can include one or more of the features discussed herein. While one or more embodiments may be discussed as having certain advantageous features, one or more of such features may also be used with the various embodiments of the invention discussed herein. In similar fashion, while exemplary embodiments may be discussed below as system or method embodiments, it is to be understood that such exemplary embodiments can be implemented in various devices, systems, and methods of the present invention.

BRIEF DESCRIPTION OF THE DRAWINGS

The following Detailed Description of the Invention is better understood when read in conjunction with the appended drawings. For the purposes of illustration, there is shown in the drawings exemplary embodiments, but the subject matter is not limited to the specific elements and instrumentalities disclosed.

FIGS. 3A-3C illustrate fluidic interconnects, in accordance with exemplary embodiments of the present invention.

FIGS. 5A-5C illustrate a chip fabrication, in accordance with an exemplary embodiment of the present invention.

FIGS. 6A-6B provide SEM images of solder fluidic interconnects, in accordance with an exemplary embodiment of the present invention.

FIG. 7 provides SEM images of integrated electrical and fluidic interconnects, in accordance with an exemplary embodiment of the present invention.

FIGS. 8A-8B provide SEM images of fluidic interconnect before and after reflow, respectively, in accordance with exemplary embodiments of the present invention.

DETAILED DESCRIPTION OF THE INVENTION

Figure 1:
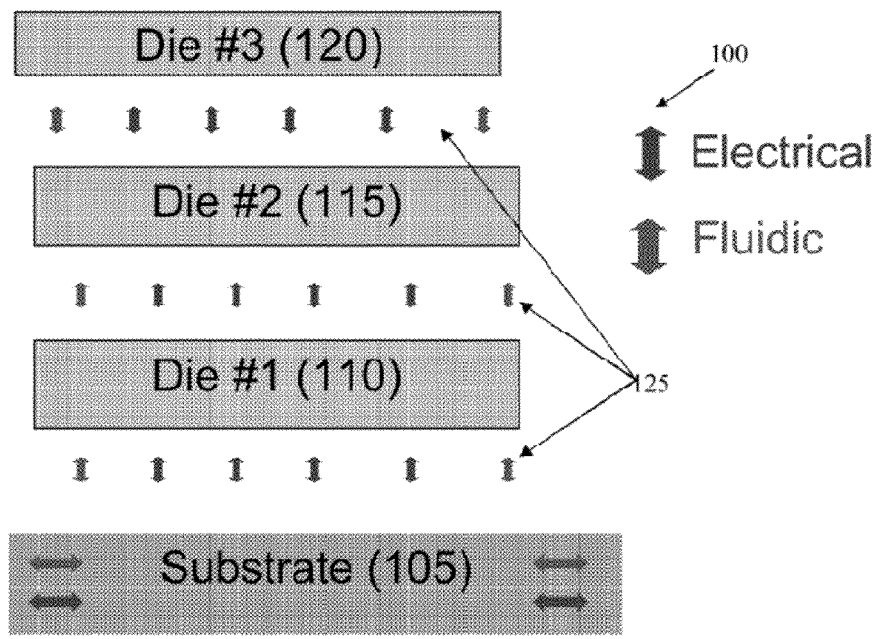
FIG. 1 provides a block diagram exploded view of a 3D IC, in accordance with an exemplary embodiment of the present invention.

To facilitate an understanding of the principles and features of the present invention, various illustrative embodiments are explained below. In particular, the invention is described in the context of being 3D ICs and methods of fabricating the same.

The components described hereinafter as making up various elements of the invention are intended to be illustrative and not restrictive. Many suitable components or steps that would perform the same or similar functions as the components or steps described herein are intended to be embraced within the scope of the invention. Such other components or steps not described herein can include, but are not limited to, for example, similar components or steps that are developed after development of the invention.

Referring now to the figures, wherein like reference numerals represent like parts throughout the several views, exemplary embodiments of the present invention will be described in detail. Throughout this description, various components may be identified as having specific values or parameters, however, these items are provided as exemplary embodiments. Indeed, the exemplary embodiments do not limit the various aspects and concepts of the present invention as many comparable parameters, sizes, ranges, combinations, and/or values may be implemented.

FIG. 1 illustrates a block diagram of an exploded, exemplary 3D IC 100 that includes a microfluidic cooling system 125 in accordance with some embodiments of the present invention. As shown, the IC package 100 generally includes a microchannel heat sink integrated into each stratum (e.g. chip) of a 3D stack. Such an arrangement can enable cooling of greater than 100 W/cm$^2$. The arrangement can also be used to providing microchannel cooling of up to ~800 W/cm$^2$. In addition, the IC package 100 generally includes a substrate 105 for carrying multiple die wafers 110, 115, 120. The cooling system 125 includes electrical and fluidic connections disposed between adjacent surfaces of the multiple die wafers 110, 115, 120.

The embodiments disclosed herein generally include a stack of wafers 110, 115, 120 with electrical and fluidic interconnections connecting the wafers in the stack. The electrical interconnections can be of many different conductors and can be implemented as through wafer vias, providing electrical communication between the wafers 110, 115, 120. The fluidic interconnections enable coolant to be routed through a wafer stack, thus providing fluid communication between the wafers 110, 115, 120. The fluidic interconnections can include pipes (e.g., polymer micro pipes, solder micro pipes, and the like) disposed between wafers and channels formed through the wafers. The pipes can be aligned with the channels in coaxial arrangement to ensure fluid flow therethrough. In some embodiments, a bather layer can be disposed or provided within the interior surfaces of the pipes and channels. Use of such a barrier layer may be desired to prevent coolant from being absorbed by the pipes and channels.

Coolant can be provided from one or more external sources in accordance with embodiments of the present invention. As coolant is provided to the IC package 100, it is routed through the IC package 100 by virtue of channels and pipes. Coolant flowing through the channels and pipes absorbs heat from the IC package 100 and due to this heat exchange system, coolant can control and/or manage heat dissipated by the IC package 100. It should be understood that embodiments of the present invention can also include embodiments where a cooling network of channels and pipes can be disposed within an IC package 100. Such a cooling network can include horizontal, diagonal, vertical, or a combination thereof, coolant channels to route coolant through an IC package 100. The channels can be routed through or on substrates and/or wafers of an IC package 100. The cooling network can be in fluid communication with the fluid interconnections, thus forming a cooling network between and among multiple chips of the IC package 100.

The IC package 100 can include multiple electrical and fluidic connections between wafers. The fluidic connections are generally disposed on opposing ends of the wafers and provide fluid channels for delivery of a coolant. Such coolant can be many materials capable of absorbing heat from the IC package 100, such that heat is moved from the IC package 100. While illustrated as vertical interconnections, the fluidic channels can be horizontal or diagonal channels for coolant. In addition, the microfluidic channels can enable horizontal coolant flow through a wafer for cooling purposes. As further shown in FIG. 1, coolant can be routed through the IC package's substrate 105. The substrate 105 can comprise a coolant inlet and outlet for transporting fluid through the IC package 100.

Utilization of microfluidic channels enables management of heat produced during operation of the IC package 100. Heat can be managed and redirected from the 3D IC package 100 by integrating microchannel heat sinks within each stratum (chip) 110, 115, 120 in the 3D stack 100. Additionally, a liquid coolant is delivered to the microchannel heat sinks within the 3D stack 100 using a thermofluidic interconnect network that comprises microfluidic chip I/Os (micropipes) and microfluidic through silicon vias ("TSVs"). The thermofluidic interconnect network within the IC package 100 can be integrated with conventional solder bumps and electrical TSVs. Integration in this arrangement enables power delivery and communication between the different chips within the 3D stack of the IC package 100.

Other embodiments and methods are also contemplated in accordance with the present invention. For example, other methods of electrical bonding are compatible with the micropipes (for example, compliant leads, Cu—Cu bonding, etc). Unlike prior work on microfluidic cooling of ICs that require millimeter-sized and bulky fluidic inlets/outlets to the microchannel heat sink, micropipe I/Os according to embodiments of the present invention are microscale, wafer-level batch fabricated, area-array distributed, flip-chip compatible, and mechanically compliant. Electrical TSVs can be, for example, fabricated with many aspect ratios, such as an aspect ratio of 8:1; other greater ratios (e.g., 49:1) are also possible in accordance with embodiments of the present invention.

Figure 2:
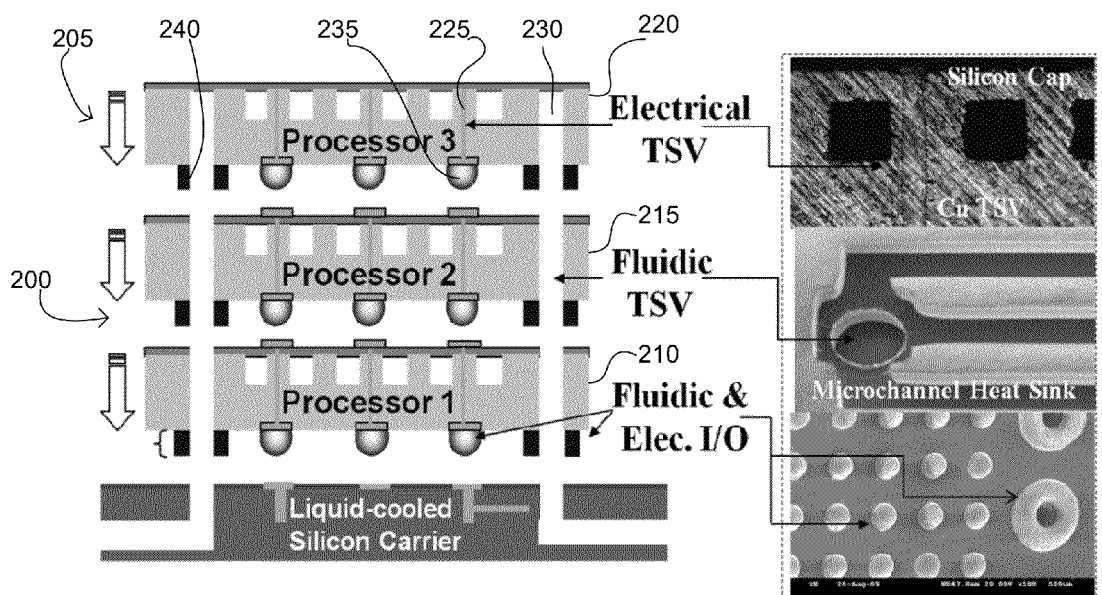
FIG. 2 provides an exploded view of a 3D IC, in accordance with an exemplary embodiment of the present invention.

FIG. 2 illustrates a block diagram of an exploded, exemplary three dimensional integrated circuit package 200 that includes a microfluidic cooling system 205 with micropipe interconnects and heat sinks in accordance with some embodiments of the present invention. As shown, the IC package 200 includes a microfluidic network cooling scheme that can cool three-dimensionally stacked ICs. Each silicon die 210, 215, 220 of the 3D stack 200 contains a monolithically integrated microchannel heat sink; through-silicon electrical (e.g. metallic-filled) vias ("TSEV") 225; through-silicon fluidic (hollow) vias ("TSFV") 230 for fluidic routing in the 3D stack 200; and electrical interconnects 235 (e.g. solder bumps) and fluidic interconnects 240 (e.g. microscale pipes) on the side of the chip opposite to the microchannel heat sink. Microscale fluidic communication between strata can be enabled by the TSFVs 230 and fluidic interconnects 240. Electrical communication between strata can be enabled by the TSEVs 225 and electrical interconnects 235. The chips can be fabricated such that when they are stacked, each chip makes electrical and fluidic interconnection to the die above and below. As a result, power delivery and signaling can be supported by the TSEVs 225 and electrical interconnects 235, and heat removal for each stratum can be supported by the TSFVs 230 and fluidic interconnects 240.

The electrical 235 and fluidic 240 interconnects of the present invention can comprise many different materials, including, but not limited to, copper, solder, polymers, and the like. This is but one advantage of the present invention over conventional 3D ICs. While conventional 3D ICs required fluidic interconnects to comprise polymers, complicating the fabrication process, in an exemplary embodiment of the present invention, both electrical 235 and fluidic 240 interconnects can comprise solder. As will be explained below, this feature has significant advantages over conventional chips, including simplification of the fabrication process and increasing the reworkabiilty of 3D ICs. FIGS. 3A-3C illustrate fluidic interconnects comprising a polymer-based material (FIG. 3A) and solder (FIGS. 3B-3C), in accordance with exemplary embodiments of the present invention.

As shown in FIG. 3C, another exemplary embodiment of the present invention provides a fluidic interconnect 300 comprising a cap 305, which can define an air-filled space 310 within the fluidic interconnect 300. Air-filled fluidic interconnects present many advantages over interconnects of conventional chips. For example, the air-filled fluidic interconnects can be transparent to the flip-chip assembly process. Additionally, air-filled fluidic interconnects can enable use of no-flow underfill in applications for which it was previously required by conventional interconnects.

Figure 4:
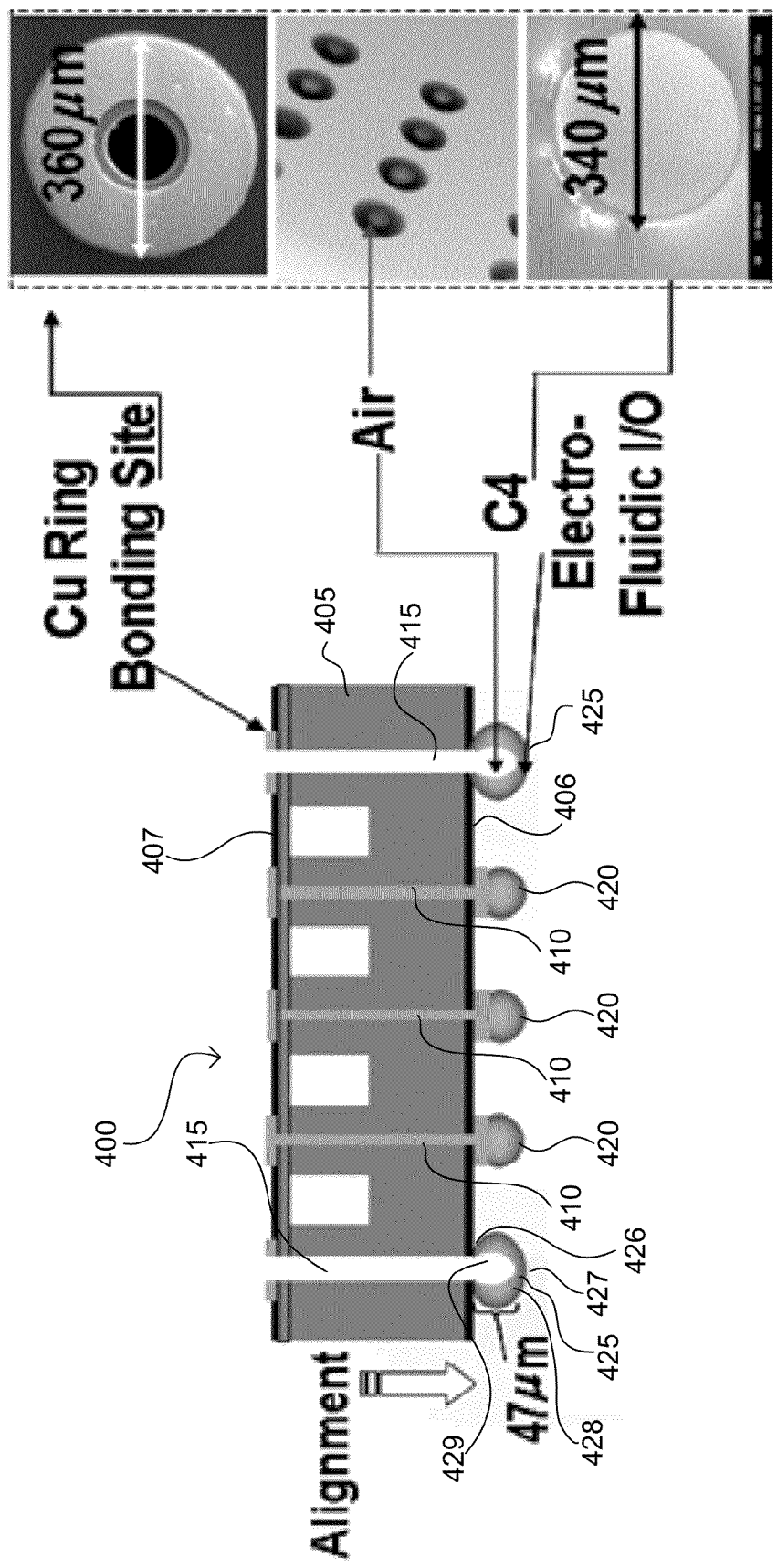
FIG. 4 provides a chip for use in fabricating a 3D IC, in accordance with an exemplary embodiment of the present invention.

Accordingly, as shown in FIG. 4, an exemplary embodiment of the present invention provides a chip 400 for use in fabricating a 3D IC comprising a wafer 405, one or more electrical vias 410, and one or more fluidic vias 415. The wafer 405 can comprise a first surface 406 and a second surface 407. In an exemplary embodiment of the present invention, the wafer 405 comprises silicon. The present invention, however, is not limited to silicon wafers; instead, as those skilled in the art would understand, the wafer 405 can comprise many different materials.

The scope of the present invention is not limited to any particular number of electrical vias 410. Instead, as those of skill in the art would understand, the number of electrical vias 410 can vary depending on the particular chip 400 and/or application for the chip 400. In an exemplary embodiment of the present invention, the one or more electrical vias 410 can be metallic-filled. As those skilled in the art would understand, the metallic filling can be many different metallic materials. For example, in some embodiments of the present invention, the one or more electrical vias 410 can be copper-filled. The electrical vias 410 can extend through the wafer 405 between the first surface 406 and the second surface 407.

In an exemplary embodiment of the present invention, the one or more electrical vias 410 can be in electrical communication with an electrical interconnect 420. The electrical interconnect(s) 420 can be proximate the first surface 406 of the wafer 405. The electrical interconnect(s) 420 can provide electrical communication between adjacent chips 400 when employed in a 3D IC.

The scope of the present invention is not limited to any particular number of fluidic vias 415. Instead, as those of skill in the art would understand, the number of fluidic vias 415 can vary depending on the particular chip 400 and/or application for the chip 400. In an exemplary embodiment of the present invention, the fluidic vias 415 are hollow, enabling flow of a fluid therethrough. In an exemplary embodiment of the present invention, the one or more fluidic vias 415 can be in fluid communication with a fluidic interconnect 425. In an exemplary embodiment of the present invention, the fluid interconnect(s) 425 can comprise a first end 426 proximate the first surface 406 of the wafer, a second end 427, and a cap 428 proximate the second end 427. As shown in FIG. 4, the cap 428 can define an air-filled space 429 within the fluidic interconnect 425. The fluid interconnects 425 can comprise many materials, in accordance with various embodiments of the present invention. In an exemplary embodiment of the present invention, the fluidic interconnects 425 comprise solder. In some exemplary embodiments of the present invention, the fluidic interconnect(s) 425 can provide fluid communication between adjacent chips 400 when employed in a 3D IC.

In addition to chips for use in 3D ICs, the present invention provides methods of fabricating chips for use in 3D ICs. FIGS. 5A-5C illustrate a chip fabrication process in accordance with various embodiments of the present invention. The method comprises providing a wafer 505 comprising one or more electrical vias 506 and one or more fluidic vias 507. The method further comprises sputtering a seed layer 510 on a first surface of the wafer 505 (FIG. 5A). The seed layer 510 can comprise many materials known in the art. In an exemplary embodiment of the present invention, the seed layer 510 comprises a Ti/Cu/Ti seed layer. The method can further comprise patterning an electroplating mold 515 on the seed layer 510 (FIG. 5B). In an exemplary embodiment of the present invention, the electroplating mold 515 is patterned using a photoresist. The electroplating mold 515 can comprise apertures 516, 517 corresponding to the one or more electrical 506 and fluidic 507 vias of the wafer 505. In an exemplary embodiment of the present invention, the electroplating mold 515 comprises a ring-shaped aperture 516 for the one or more fluidic interconnects 520 and a circular aperture 517 for each of the one or more electrical interconnects 525. The scope of the present invention is not limited to any particular shape of aperture; instead, as those skilled in the art would understand, the apertures of the present invention can be many shapes, including, but not limited to, square-shaped, oval-shaped, and the like.

The method can further comprise simultaneously electroplating material (e.g. solder) into each of the apertures 516, 517 of the electroplating mold. For example, in some embodiments of the present invention, after electroplating a Ni under-bump metallization layer, solder can be electroplated in the mold 515. As used herein, simultaneously can mean at the same time or substantially at the same time. Thus, some embodiments of the present invention allow for the fabrication of electrical and fluidic interconnects at the same time, e.g. a single electroplating step. This is an improvement over conventional fabrication methods, which require separate steps for fabrication of electrical and fluidic interconnects.

FIG. 7 provides SEM images of integrated electrical 705 and fluidic 710 interconnects fabricated during a single masking step in accordance with an exemplary embodiment of the present invention. As shown, an exemplary chip fabrication method of the present invention can yield high density electrical interconnects 705 (~1600/cm$^2$), which can have a pitch of 240 μm (smaller and larger pitches are also possible and included within the scope of the present invention). Adjacent fluidic interconnects 710 can have a pitch of about 480 μm (smaller and larger pitches are also possible and included within the scope of the present invention). Further, some embodiments of the present invention are capable of fabricating electrical 705 and fluidic 710 interconnects yielding features with good uniformity and a standard deviation in feature size of <1 μm.

In an exemplary embodiment of the present invention, the method further comprises removing the electroplating mold 515. In another exemplary embodiment of the present invention, the method further comprises removing the seed layer 510. In yet another exemplary embodiment of the present invention, the method further comprises reflowing (e.g. heating) the solder. FIGS. 6A and 6B provide scanning electron microscope ("SEM") images of 30 μm solder fluidic interconnects before (FIG. 6A) and after (FIG. 6B) reflow, in accordance with an exemplary embodiment of the present invention. The inner-diameter of the fluidic interconnects is 120 μm, and the outer-diameter is 340 μm.

Figure 9:
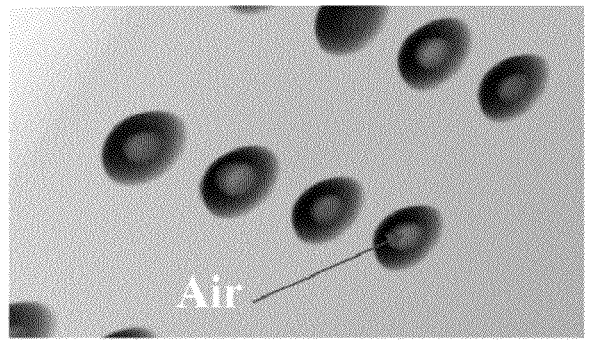
FIG. 9 provides x-ray images of air-filled fluidic interconnects, in accordance with an exemplary embodiment of the present invention.

As discussed above, some embodiments of the present invention provide chips with air-filled fluidic interconnects. To fabricate such interconnects, in an exemplary embodiment of the present invention, the method of fabricating a chip comprises electroplating solder to a height greater than the height 530 of the electroplating mold 515 (FIG. 5). For purposes of illustration, and not to be interpreted as limiting the scope of the present invention, in an exemplary chip fabrication method of the present invention, 50 μm of solder can be plated in a 25 μm electroplating mold. As the height of the electroplating mold is 25 μm, solder is over-plated by a height of 25 μm to form a 50 μm tall solder pipe-like fluidic interconnect. However, when over-plating solder (i.e. the height of the plated solder is greater than the height of the electroplating resist mold), the inner diameter of the electroplating can decrease, e.g. to 25 μm, as shown in FIG. 8A. Because of the decreased inner diameter, the solder at the top of the structure can merge after reflow, forming a cap at the end of the fluidic interconnect, as shown in FIG. 8B. Although the reflowed fluidic interconnects appear as solder bumps, the domed structures can actually have an air-filled depression within the interconnects. This air-filled void is verified by x-ray images of the structure taken after reflow, as shown in FIG. 9.

Figure 10:
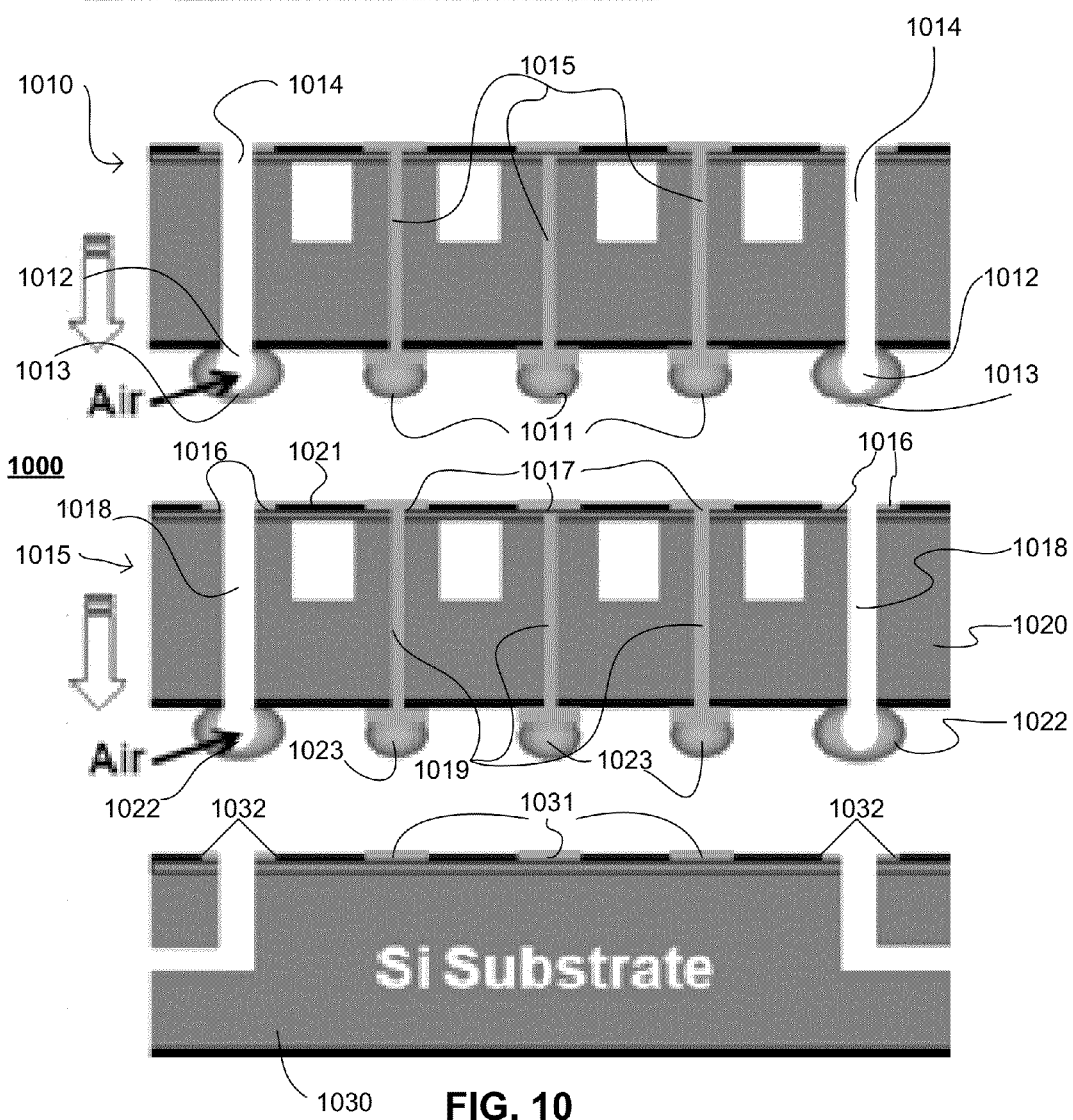
FIG. 10 provides an exploded view of a 3D IC prior to assembly, in accordance with an exemplary embodiment of the present invention.

As shown in FIG. 10, individual chips 1010, 1015 can be used to fabricate a 3D IC 1000, in accordance with an exemplary embodiment of the present invention. Accordingly, an exemplary embodiment of the present invention provides a method of fabricating a 3D IC 1000 comprising providing a first chip 1010, providing a second chip 1015, the second chip 1015 comprising binding elements 1016, 1017 proximate electrical 1019 and fluidic 1018 vias of the second chip 1015 at a second surface 1021 of a wafer 1020 of the second chip 1015, aligning the first 1010 and second 1015 chip, such that electrical 1011 and fluidic 1012 interconnects of the first chip 1010 are positioned proximate the corresponding binding elements 1016, 1017 of the electrical 1019 and fluidic 1018 vias of the second chip 1015, and wetting the binding elements 1016, 1017 to bind the first chip 1010 to the second chip 1015. In an exemplary embodiment of the present invention, wetting removes at least a portion of the cap 1013 of the fluidic interconnects 1012, such that the fluidic interconnects 1012 of the first chip 1010 provide fluid communication between fluidic vias 1014 of the first chip 1010 and corresponding fluidic vias 1018 of the second chip 1015. In another exemplary embodiment of the present invention, wetting causes the electrical interconnects 1011 of the first chip 1010 to provide electrical communication between electrical vias 1015 of the first chip 1010 and corresponding electrical vias 1019 of the second chip 1015.

Figure 11:
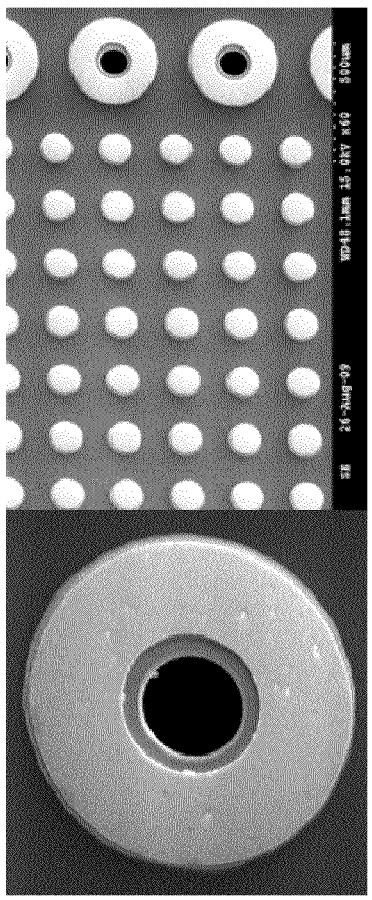
FIG. 11 provides SEM images of a substrate with patterned copper rings, in accordance with an exemplary embodiment of the present invention.

In an exemplary embodiment of the present invention, the binding elements 1016, 1017 comprise a solder wettable material. The solder wettable material can be many solder wettable materials known in the art. In an exemplary embodiment of the present invention, the solder wettable material is copper. Additionally, the binding elements 1016, 1017 can be many different shapes. In an exemplary embodiment of the present invention, the binding elements 1016, 1017 are ring-shaped. As shown in FIG. 11, the binding elements can be patterned copper rings (FIG. 11 provides a cross-sectional view).

In another exemplary embodiment of the present invention, the second chip 1015 can be assembled to a substrate 1030 having binding elements 1031, 1032, as shown in FIG. 10. The binding elements 1031, 1032 can be copper rings having a slightly larger outer diameter than the fluidic interconnects 1022 of the first chip 1010. Copper can be deposited on the substrate 1030, and the rings can be patterned by oxide or polymer, as shown in FIG. 11. If patterning the rings with a polymer layer, an appropriate thickness of the polymer can provide an additional level of fluidic scaling. In some exemplary embodiments of the present invention, the electrical interconnects 1023 of the second chip 1015 can have a height greater than the height of the fluidic interconnects 1022, thus ensuring electrical communication.

Figure 12:
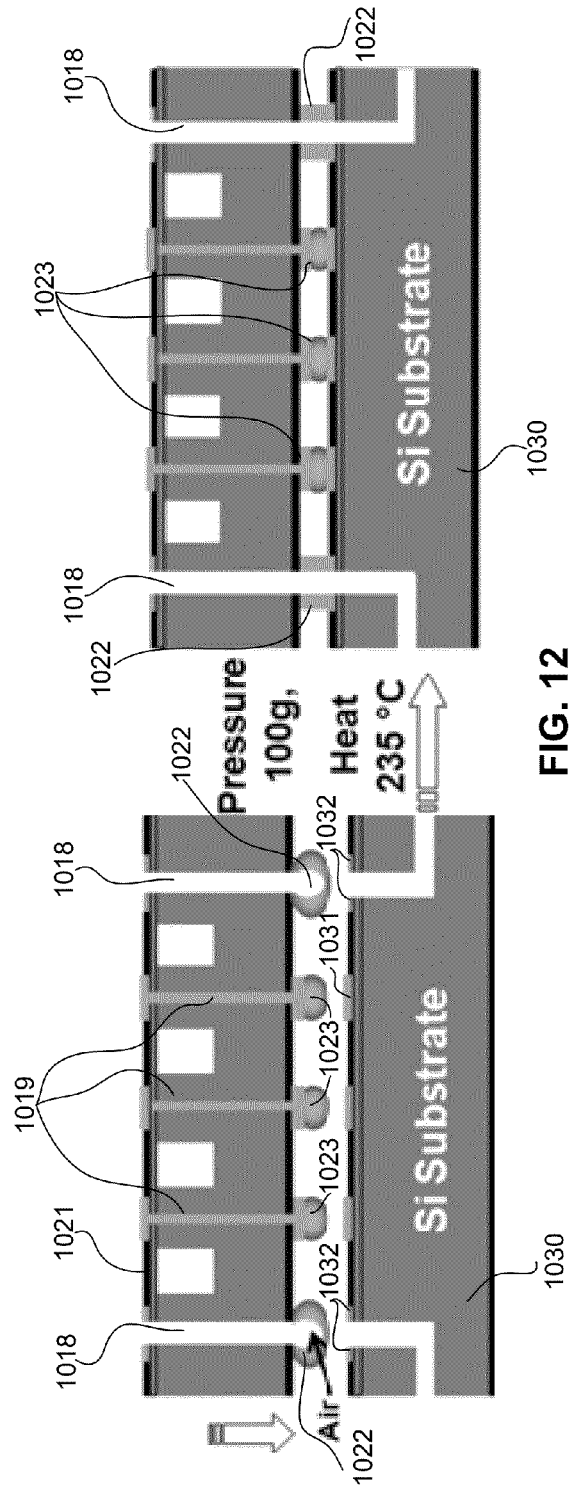
FIG. 12 illustrates a 3D IC before and after assembly, in accordance with an exemplary embodiment of the present invention.
Figure 13A:
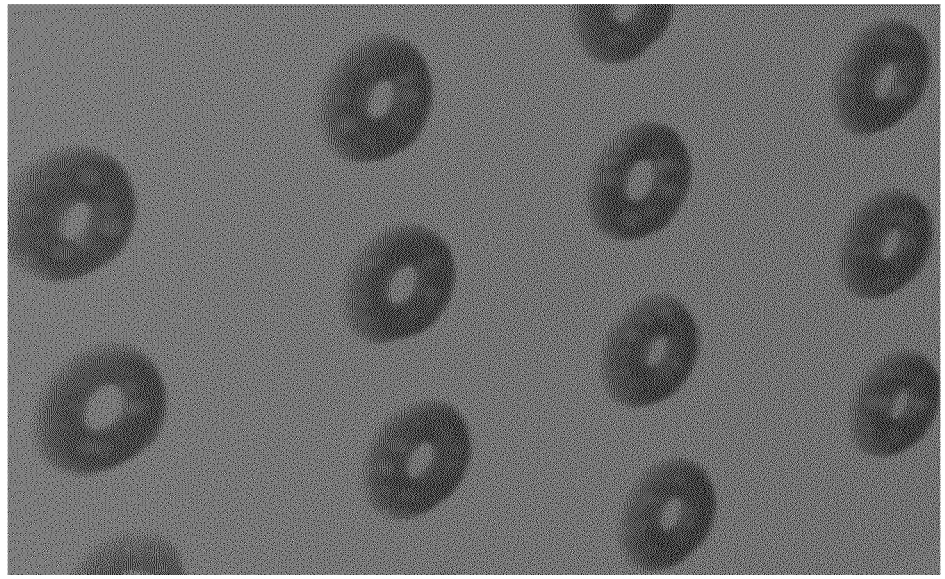
FIGS. 13A-13B provide SEM images of fluidic interconnects, in accordance with an exemplary embodiment of the present invention.
Figure 13B:
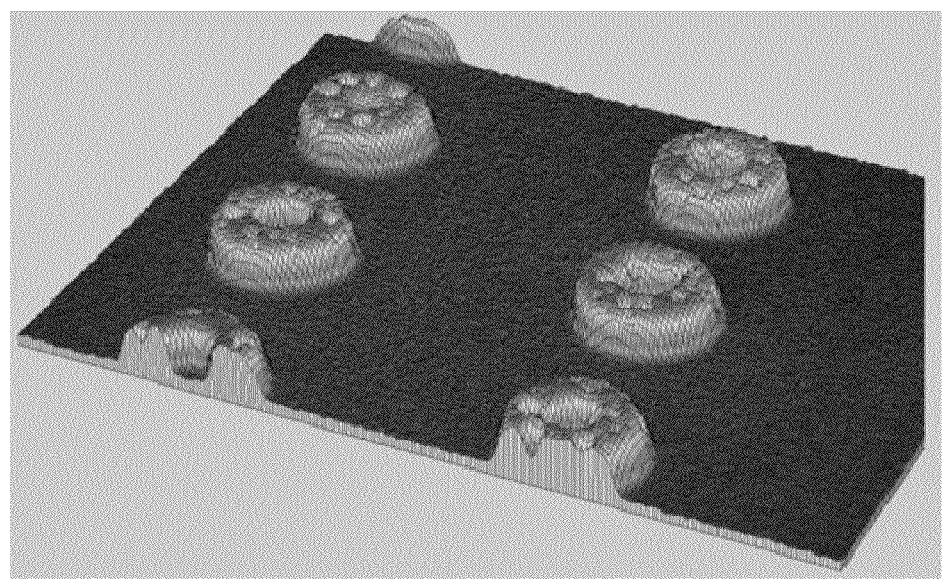

The second chip can be attached to the substrate via the wetting process discussed above. As shown in FIG. 12, in some embodiments of the present invention, when the second chip 1015 comprises air-filled fluidic interconnects 1022 and is assembled to the substrate 1030, the solder only wets the binding element 1032 on the substrate. Thus, the assembly of the chip 1015 to the binding elements 1032 of the substrate 1030 enables the air-filled fluidic interconnects 1022 to transform into pipe-like fluidic interconnects, providing fluid communication between the second chip 1015 and the substrate 1030. This is illustrated by the x-ray images of the interconnects shown in FIGS. 13A-13B.

Figure 14:
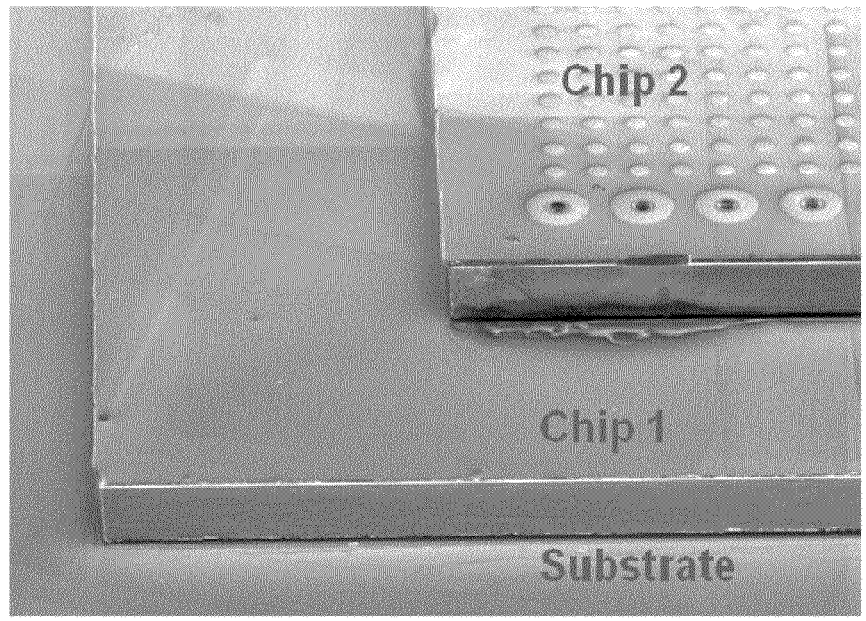
FIG. 14 provides an SEM image of a 3D IC, in accordance with an exemplary embodiment of the present invention.
Figure 15:
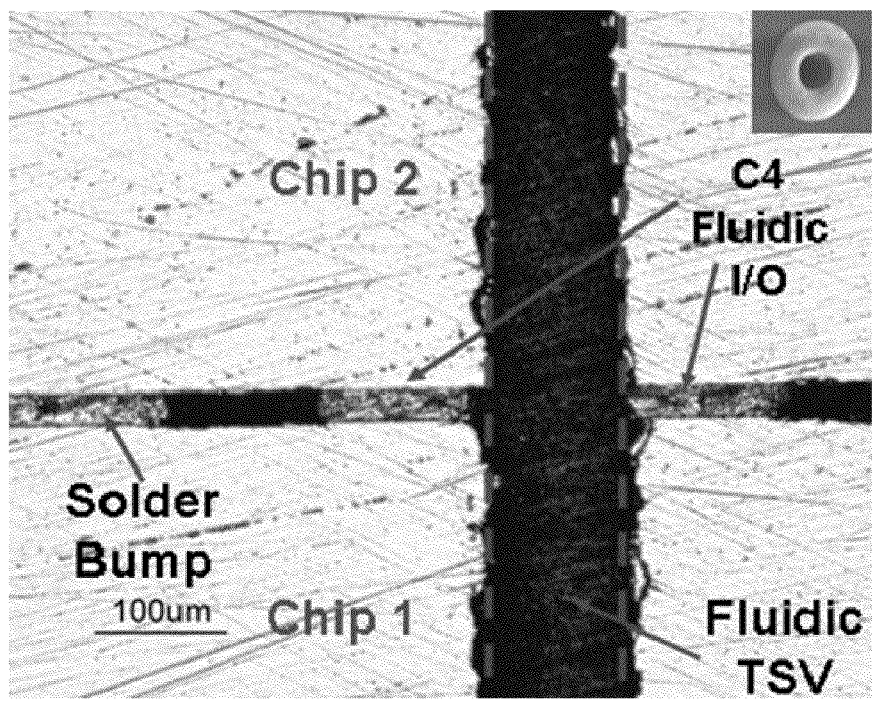
FIG. 15 provides a cross-sectional optical image of a 3D IC, in accordance with an exemplary embodiment of the present invention.

FIG. 14 provides and SEM image perspective view of an assembled 3D IC stack of two microfluidic chips on a substrate, in accordance with an exemplary embodiment of the present invention. FIG. 15 provides a cross-sectional optical image of a 3D IC stack assembled using solder fluidic and electrical interconnects, in accordance with an exemplary embodiment of the present invention.

It is to be understood that the embodiments and claims disclosed herein are not limited in their application to the details of construction and arrangement of the components set forth in the description and illustrated in the drawings. Rather, the description and the drawings provide examples of the embodiments envisioned. The embodiments and claims disclosed herein are further capable of other embodiments and of being practiced and carried out in various ways. Also, it is to be understood that the phraseology and terminology employed herein are for the purposes of description and should not be regarded as limiting the claims.

Accordingly, those skilled in the art will appreciate that the conception upon which the application and claims are based may be readily utilized as a basis for the design of other structures, methods, and systems for carrying out the several purposes of the embodiments and claims presented in this application. It is important, therefore, that the claims be regarded as including such equivalent constructions.

Furthermore, the purpose of the foregoing Abstract is to enable the United States Patent and Trademark Office and the public generally, and especially including the practitioners in the art who are not familiar with patent and legal terms or phraseology, to determine quickly from a cursory inspection the nature and essence of the technical disclosure of the application. The Abstract is neither intended to define the claims of the application, nor is it intended to be limiting to the scope of the claims in any way. It is intended that the application is defined by the claims appended hereto.

What is claimed is:

1. A chip for use in fabricating a three-dimensional integrated circuit, the chip comprising:
a wafer comprising a first surface and a second surface;
one or more hollow, fluidic vias extending through the wafer between the first surface and the second surface; and
one or more fluidic interconnects;
wherein each fluidic via is in fluid communication with a fluidic interconnect, and
wherein a fluidic interconnect comprises a first end proximate the first surface of the wafer, a second end, and a cap proximate the second end, the cap defining an air-filled space within the fluidic interconnect wherein the cap comprises solder.

2. The chip of claim 1 further comprising:
one or more metallic-filled, electrical vias extending through the wafer between the first surface and the second surface; and
one or more electrical interconnects;
wherein each electrical via is in electrical communication with an electrical interconnect proximate the first surface.

3. A method of fabricating the chip of claim 1, the method comprising:
providing the wafer comprising one or more fluidic vias;
sputtering a seed layer on the first surface of the wafer;
patterning an electroplating mold into the seed layer, the electroplating mold comprising an aperture for each of the one or more fluidic vias; and
electroplating solder into the apertures of the electroplating mold.

4. The method of claim 2 further comprising removing the electroplating mold.

5. The method of claim 2 further comprising reflowing solder.

6. The method of claim 2, wherein electroplating solder comprises depositing solder to a height greater than a height of the electroplating mold.

7. The method of claim 5, wherein reflowing solder forms caps, the caps defining air-filled spaces within fluid interconnects.

8. A method of fabricating a three-dimensional integrated circuit from chips, the method comprising:
providing a first chip comprising the chip of claim 1;
providing a second chip comprising the chip of claim 1, wherein the one or more fluidic vias of the second chip comprise a binding element proximate the second surface of the wafer of the second chip, the binding element comprising a solder wettable material;
aligning the first chip and second chip, such that the one or more fluidic interconnects of the first chip are positioned proximate corresponding binding elements of the second chip; and
wetting the binding elements to bind the first chip to the second chip;
wherein wetting removes at least a portion of the cap of each fluidic interconnect of the first chip, such that the fluidic interconnects of the first chip provide fluid communication between the one or more fluidic vias of the first chip and corresponding fluidic vias of the second chip.

9. The of the claim 8, wherein the solder wettable material comprises copper.

10. The method of claim 8, wherein at least one of the binding elements is ring-shaped.

11. A method of fabricating a three-dimensional integrated circuit, the method comprising:
fabricating a first chip comprising:
providing a wafer comprising one or more electrical vias and one or more fluidic vias;
sputtering a seed layer on a first surface of the wafer;
patterning an electroplating mold into the seed layer, the electroplating mold comprising an aperture for each of the one or more fluidic vias and an aperture for each of the one or more electrical vias; and
simultaneously electroplating solder into each aperture of the electroplating mold to form an air-filled, fluidic interconnect proximate each of the one or more fluidic vias and an electrical interconnect proximate each of the one or more electrical vias, the air-filled fluidic interconnects comprising caps defining an air-filled space within the fluidic interconnects.

12. The method of claim 11 further comprising:
fabricating a second chip; and
aligning the first chip with the second chip.

13. The method of claim 11 further comprising removing the electroplating mold.

14. The method of claim 11 further comprising reflowing solder.

15. The method of claim 11, wherein simultaneously electroplating solder comprises depositing solder to a height greater than a height of the electroplating mold.

16. The method of claim 11 further comprising merging solder at a top of the apertures corresponding to the one or fluidic vias to form a cap.

17. The method of claim 12, wherein the second chip comprises:
a second wafer comprising a first surface and a second surface;
one or more metallic-filled, electrical vias extending through the second wafer between the first surface and second surface;
one or more hollow, fluidic vias extending through the second wafer between the first surface and the second surface; and
a plurality of binding elements corresponding to and positioned adjacent each of the electrical and fluidic vias proximate the first surface of the second wafer.

18. The method of claim 17 further comprising:
aligning the first chip and the second chip such that the fluidic interconnects of the first chip and the electrical interconnects of the first chip are positioned proximate corresponding binding elements of the second chip; and
wetting the binding elements to bind the first chip to the second chip;

wherein wetting removes at least a portion of the cap of each fluidic interconnect of the first chip, such that the fluidic interconnects of the first chip provide fluid communication between the one or more fluidic vias of the first chip and corresponding fluidic vias of the second chip; and wherein wetting causes the electrical interconnects of the first chip to provide electrical communication between the one or more electrical vias of the first chip and corresponding electrical vias of the second chip.

19. The method of the claim 18, wherein the solder wettable material comprises copper.

20. The method of claim 18, wherein at least one of the binding elements is ring-shaped.

* * * * *